United States Patent [19]

Hawes

[11] Patent Number: 5,315,539
[45] Date of Patent: May 24, 1994

[54] METHOD AND APPARATUS FOR DEBOUNCING SIGNALS

[75] Inventor: M. Kerrigan Hawes, Pittsford, N.Y.

[73] Assignee: Xerox Corporation, Stamford, Conn.

[21] Appl. No.: 949,933

[22] Filed: Sep. 24, 1992

[51] Int. Cl.$^5$ ........................................... H04L 15/06
[52] U.S. Cl. .................................. 364/224.01; 341/24
[58] Field of Search ...................... 364/724.01, 709.01; 341/24

[56] References Cited

U.S. PATENT DOCUMENTS

| | | | |
|---|---|---|---|
| 3,886,543 | 5/1975 | Marin | 341/24 |
| 4,149,258 | 4/1979 | Yahata et al. | 364/724.01 |
| 4,523,104 | 6/1985 | Norris et al. | 341/24 |
| 4,549,094 | 10/1985 | Floyd | 341/24 |

Primary Examiner—David H. Malzahn
Attorney, Agent, or Firm—Oliff & Berridge

[57] ABSTRACT

Debounce and lockout filters include an input part for receiving a plurality of input signals from switches, a microprocessor and an output part. The filters simultaneously process a plurality of input binary signals in parallel according to a sequence of mask values which individually adjust the filter response function for each of the individual filter channels. A multichannel filter has a filter simultaneously filtering each input signal of a plurality of input signals, the filter including a plurality of independent filter channels, each independent filter channel filtering a corresponding input signal of the plurality of input signals to produce a corresponding output signal of a plurality of output signals. The multichannel filter also has a mechanism for independently adjusting a filter response time of each independent filter channel.

7 Claims, 11 Drawing Sheets

FIG. 8

| $C_{n-1}$ | $R_n$ | $C_n$ |
|---|---|---|
| 0 | 0 | 0 |
| 0 | 1 | 1 |
| 1 | 0 | 0 |
| 1 | 1 | 1 |

FIG. 9

| $C_{n-1}$ | $R_{n-1}$ | $R_n$ | $C_n$ |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

FIG. 10

| $C_{n-1}$ | $R_{n-2}$ | $R_{n-1}$ | $R_n$ | $C_n$ |
|---|---|---|---|---|
| 0 | 0 | 0 | 0 | 0 |
| 0 | 0 | 0 | 1 | 0 |
| 0 | 0 | 1 | 0 | 0 |
| 0 | 0 | 1 | 1 | 0 |
| 0 | 1 | 0 | 0 | 0 |
| 0 | 1 | 0 | 1 | 0 |
| 0 | 1 | 1 | 0 | 0 |
| 0 | 1 | 1 | 1 | 1 |
| 1 | 0 | 0 | 0 | 0 |
| 1 | 0 | 0 | 1 | 1 |
| 1 | 0 | 1 | 0 | 1 |
| 1 | 0 | 1 | 1 | 1 |
| 1 | 1 | 0 | 0 | 1 |
| 1 | 1 | 0 | 1 | 1 |
| 1 | 1 | 1 | 0 | 1 |
| 1 | 1 | 1 | 1 | 1 |

FIG. 11

| $C_{n-1}$ | $R_{n-2}$ | $R_{n-1}$ | $R_n$ | $C_n$ |
|---|---|---|---|---|
| 0 | 0 | 0 | 0 | 0 |
| 0 | 0 | 0 | 1 | 1 |
| 0 | 0 | 1 | 0 | 0 |
| 0 | 0 | 1 | 1 | 1 |
| 0 | 1 | 0 | 0 | 0 |
| 0 | 1 | 0 | 1 | 1 |
| 0 | 1 | 1 | 0 | 0 |
| 0 | 1 | 1 | 1 | 1 |
| 1 | 0 | 0 | 0 | 0 |
| 1 | 0 | 0 | 1 | 1 |
| 1 | 0 | 1 | 0 | 0 |
| 1 | 0 | 1 | 1 | 1 |
| 1 | 1 | 0 | 0 | 0 |
| 1 | 1 | 0 | 1 | 1 |
| 1 | 1 | 1 | 0 | 0 |
| 1 | 1 | 1 | 1 | 1 |

FIG. 12

| $C_{n-1}$ | $R_{n-2}$ | $R_{n-1}$ | $R_n$ | $C_n$ |
|---|---|---|---|---|
| 0 | 0 | 0 | 0 | 0 |
| 0 | 0 | 0 | 1 | 0 |
| 0 | 0 | 1 | 0 | 0 |
| 0 | 0 | 1 | 1 | 1 |
| 0 | 1 | 0 | 0 | 0 |
| 0 | 1 | 0 | 1 | 0 |
| 0 | 1 | 1 | 0 | 0 |
| 0 | 1 | 1 | 1 | 1 |
| 1 | 0 | 0 | 0 | 0 |
| 1 | 0 | 0 | 1 | 1 |
| 1 | 0 | 1 | 0 | 1 |
| 1 | 0 | 1 | 1 | 1 |
| 1 | 1 | 0 | 0 | 0 |
| 1 | 1 | 0 | 1 | 1 |
| 1 | 1 | 1 | 0 | 1 |
| 1 | 1 | 1 | 1 | 1 |

| $C_{n-1}$ | $R_{n-2}$ | $R_{n-1}$ | $R_n$ | $C_n$ |
|---|---|---|---|---|
| 0 | 0 | 0 | 0 | 0 |
| 0 | 0 | 0 | 1 | 0 |
| 0 | 0 | 1 | 0 | 0 |
| 0 | 0 | 1 | 1 | 0 |
| 0 | 1 | 0 | 0 | 0 |
| 0 | 1 | 0 | 1 | 0 |
| 0 | 1 | 1 | 0 | 0 |
| 0 | 1 | 1 | 1 | 1 |
| 1 | 0 | 0 | 0 | 0 |
| 1 | 0 | 0 | 1 | 1 |
| 1 | 0 | 1 | 0 | 1 |
| 1 | 0 | 1 | 1 | 1 |
| 1 | 1 | 0 | 0 | 1 |
| 1 | 1 | 0 | 1 | 1 |
| 1 | 1 | 1 | 0 | 1 |
| 1 | 1 | 1 | 1 | 1 |

| $L_{n-1}$ | $R_n$ | $L_n$ |
|---|---|---|
| 0 | 0 | 0 |
| 0 | 1 | 1 |
| 1 | 0 | 0 |
| 1 | 1 | 1 |

FIG. 20

| $L_{n-2}$ | $L_{n-1}$ | $R_n$ | $L_n$ |
|---|---|---|---|
| 0 | 0 | 0 | 0 |
| 0 | 0 | 1 | 1 |
| 0 | 1 | 0 | 1 |
| 0 | 1 | 1 | 1 |
| 1 | 0 | 0 | 0 |
| 1 | 0 | 1 | 0 |
| 1 | 1 | 0 | 0 |
| 1 | 1 | 1 | 1 |

FIG. 21

| $L_{n-3}$ | $L_{n-2}$ | $L_{n-1}$ | $R_n$ | $L_n$ |
|---|---|---|---|---|
| 0 | 0 | 0 | 0 | 0 |
| 0 | 0 | 0 | 1 | 1 |
| 0 | 0 | 1 | 0 | 1 |
| 0 | 0 | 1 | 1 | 1 |
| θ | + | θ | θ | θ |
| θ | + | θ | + | + |
| 0 | 1 | 1 | 0 | 1 |
| 0 | 1 | 1 | 1 | 1 |
| 1 | 0 | 0 | 0 | 0 |
| 1 | 0 | 0 | 1 | 0 |
| + | θ | + | θ | θ |
| + | θ | + | + | + |
| 1 | 1 | 0 | 0 | 0 |
| 1 | 1 | 0 | 1 | 0 |
| 1 | 1 | 1 | 0 | 0 |
| 1 | 1 | 1 | 1 | 1 |

METHOD AND APPARATUS FOR DEBOUNCING SIGNALS

BACKGROUND OF THE INVENTION

1. Field of the Invention

This invention relates to a method and apparatus for debouncing electrical signals. In particular, this invention relates to a filter for simultaneously processing multiple noisy signals to produce multiple corresponding debounced signals.

2. Description of the Related Art

Within copiers or other systems, there are a large number of binary input signals used to control the system. These signals come from sensors or switches in the system. Most switches and some sensors suffer from a phenomenon called bounce when changing state.

FIG. 1 shows a simple switch circuit 10 containing switch 12, voltage source 14 and resistor 16. Output voltage V will depend on the switch state of switch 12. When the switch is changed from an open to a closed state, current flows through the resistor and the voltage V at the output increases from zero volts to the voltage of the voltage source 14. When the switch is changed from a closed state to an open state, the voltage V at the output returns to zero volts.

FIG. 2 shows a graph of the voltage V as a function of time T. When switch 12 is changed from an open state to a closed state at time $T_0$ the output voltage V attains the voltage of the voltage source 14 after undergoing a noisy transition as shown in FIG. 2. When processed through digital circuits, the noisy signal of output voltage V becomes a binary signal (having an on state and an off state). The binary signals often have a significant bounce time as shown in FIG. 14. Without proper filtering, the bouncing signal shown in FIG. 14, may be interpreted by a machine as multiple actuations of switch 12.

Many modern systems are controlled by microprocessors. When a bouncing signal is input to a microprocessor controlled system, the bouncing signal can cause a number of problems for the software running on the microprocessor if the bouncing signal is not properly filtered. A debounce filter, whether implemented in hardware or software, waits until the input signal has stabilized for a specific period of time before changing the output signal from the filter. The software controlled microprocessor then uses the filtered signal as the control signal for the microprocessor controlled system. Such a debounce filter has a debounce filter time delay as shown in FIG. 5.

A complication in designing large systems arises from two properties. The first is that different switches and sensor types are often characterized by different bounce times, thus requiring different filters and different filter characteristics. The second is that a large system often imposes different timing requirements, such as the maximum tolerable delay, on the signals coming from the several switches and sensors in the system. Therefore, it is often necessary to process signals from different switches through different filter types to produce the corresponding filtered signals.

One method of filtering input signals is a two sample approach where two samples are sequentially taken and compared. If the two samples agree, then the value of the two samples is output as the filter output.

In another method of filtering input signals, the input voltage V is sampled at a regular rate. If the input sampled signal changes state, then a counter is incremented at the sample rate as long as the input signal differs from the present filter output. When the counter reaches a particular maximum value, then the filter output changes. If the input signal changes back to the present filter output value while the counter is still being incremented, then the counter is reset. In this method it is necessary to have a counter for every signal input to be debounced. In a microprocessor based filter system, this results in a large use of RAM and significant execution time for every input.

FIG. 6 is a timing diagram for the method using a counter where the counter is set to 6. This method is superior to the two sample approach in that more samples are taken, reducing the chance of incorrect reporting. However, this method uses even more time than the two sample approach.

SUMMARY OF THE INVENTION

It is an object of the present invention to overcome limitations of the related art. It is another object of the present invention to provide a microprocessor based filter system for simultaneously processing a plurality of noisy input signals. It is yet another object of the present invention to provide a microprocessor based filter system for individually adjusting the filter response times of filter channels processing a plurality of simultaneously processed noisy input signals.

These and other objects are achieved with a debounced filter for processing a plurality of binary signals representative of a corresponding plurality of switch outputs to produce a corresponding plurality of filtered signals. Each binary signal is a sequence of binary values, one value from each sequence of binary values being a current binary value. Each filtered signal is a sequence of filtered values, one value from each sequence of filtered values being a current filtered value. The filter includes a boolean processor having a plurality of signal filters for simultaneously processing each of the plurality of binary signals through a corresponding signal filter of the plurality of signal filters to produce the corresponding plurality of filtered signals. Each signal filter processes the corresponding current binary value and a predetermined number of other values from the corresponding sequence of binary values occurring prior to the current binary value to produce the corresponding current filtered value. The filter also includes a repeating mechanism for successively operating the boolean processor to produce, from each signal filter of the plurality of signal filters, the corresponding sequence of filtered values. Each value in the corresponding sequence of filtered values is a current filtered value corresponding to the corresponding current binary value and the predetermined number of other values. A successive current filtered value is produced by each signal filter each time the boolean processor is operated.

These and other objects are achieved with a lockout filter for processing a plurality of binary signals representative of a corresponding plurality of switch outputs to produce a corresponding plurality of filtered signals. Each binary signal is a sequence of binary values, one value from each sequence of binary values being a current binary value. Each filtered signal is a sequence of filtered values, one value from each sequence of filtered values being a current filtered value. The filter includes a boolean processor having a plurality of signal filters for simultaneously processing each of the plurality of binary signals through a corresponding signal filter of the plurality of signal filters to produce the corresponding plurality of filtered signals. Each signal filter processes the corresponding current binary value and a predetermined number of other values from the corresponding sequence of filtered values occurring prior to the current filtered value to produce the corresponding current filtered value. The filter also includes a repeating mechanism for successively operating the boolean processor to produce, from each signal filter of the plurality of signal filters, the corresponding sequence of current filtered values. Each value in the corresponding sequence of current filtered values is a current filtered value corresponding to the corresponding current binary value and the predetermined number of other values. A successive current filtered value is produced by each signal filter each time the boolean processor is operated.

BRIEF DESCRIPTION OF THE DRAWINGS

The invention will be described in detail in the following description of preferred embodiments with reference to the following figures wherein:

FIGS. 8-13 are tables showing debounce filter outputs as a function of binary signal inputs;

FIGS. 19-21 are tables showing lockout filter output as a function of binary signal inputs.

DESCRIPTION OF PREFERRED EMBODIMENTS

Figure 2:
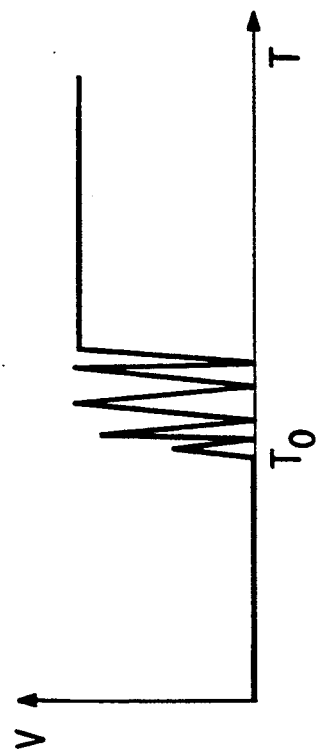
FIG. 2 is a graph of the output voltage produced by the circuit of FIG. 1.
Figure 1:
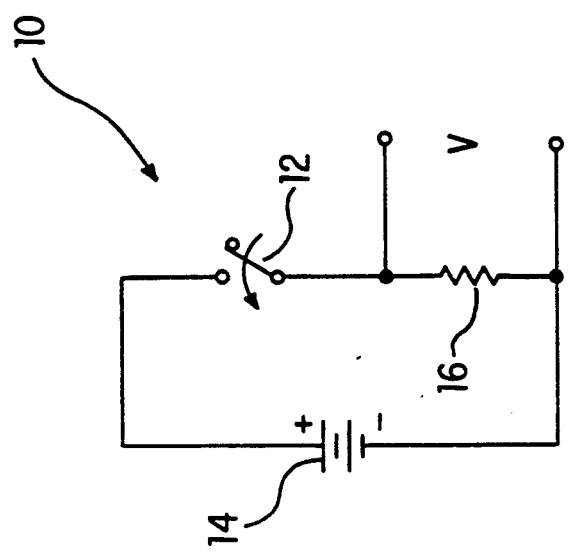
FIG. 1 is a schematic diagram of a representative switch circuit.
Figure 3:
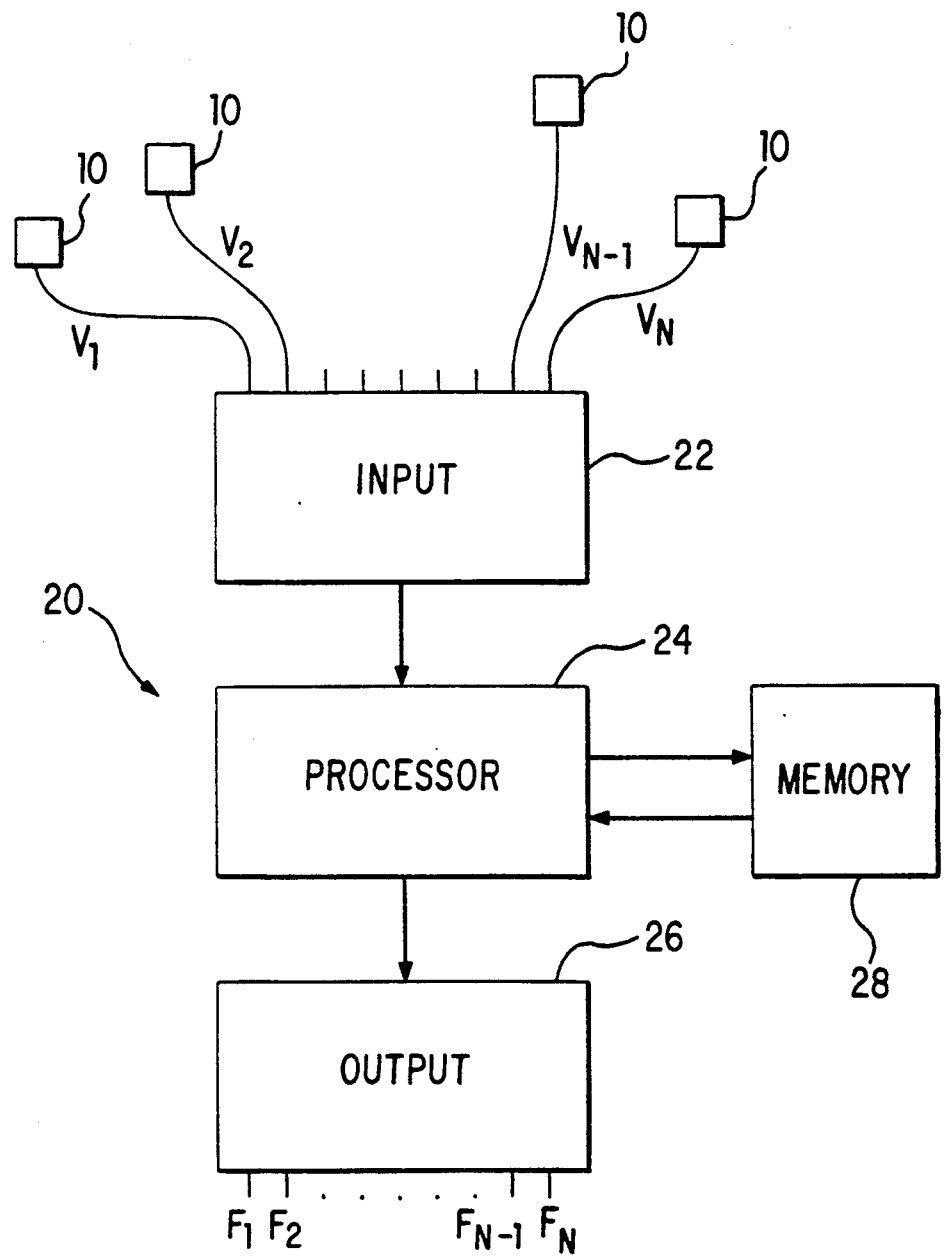
FIG. 3 is a block diagram of the filter processor of the present invention.
Figure 4:
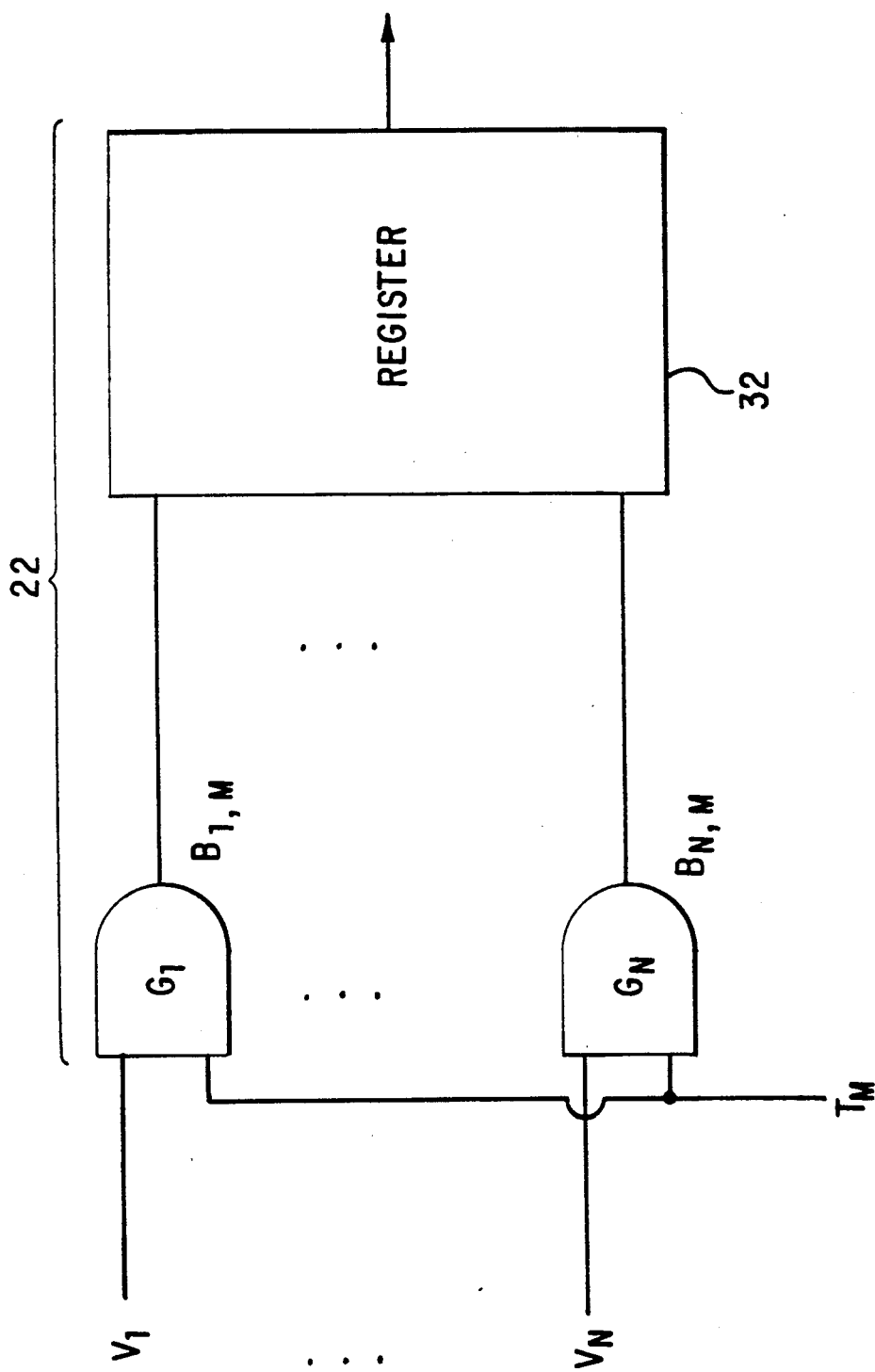
FIG. 4 is a logic schematic representative of the input part of the filter of the present invention.

In FIG. 3, filter 20 includes input part 22, processor 24, output part 26 and memory 28. Input to the filter processor are a plurality of voltage signals $V_1-V_N$. Outputs from filter 20 include filtered signals $F_1-F_N$. Inputs $V_1-V_N$ are produced by switch circuits 10. FIG. 4 shows a representative logic schematic of input part 22. Input voltages $V_1-V_N$ are provided to corresponding gates $G_1-G_n$. Sampling signal $T_M$ is provided to each of the gates $G_1-G_N$ to produce binary signals $B_{1,M}-B_{N,M}$. Signals $B_{1,M}-B_{N,M}$ constitute a plurality of binary signals having a sequence of values indexed on index designator M. A current value from each of the plurality of binary signals is provided to register 32 where the plurality of current values are retained until read in by processor 24. Preferably input part 22 is part of a microprocessor comprised of input part 22, processor 24 and output part 26. A multiplexer may be advantageously interposed between switch circuits 10 and input part 22 to select between multiple sets of switch voltage V.

Figure 5:
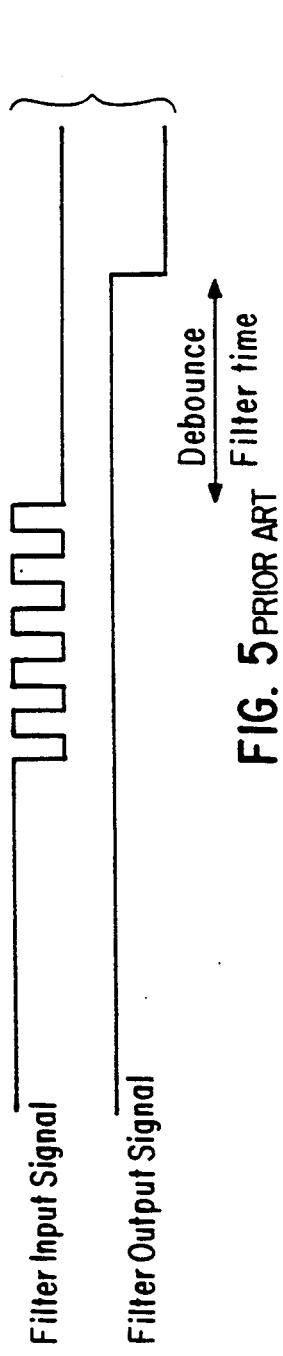
FIG. 5 is a timing diagram showing debounce filter time delay.
Figure 6:
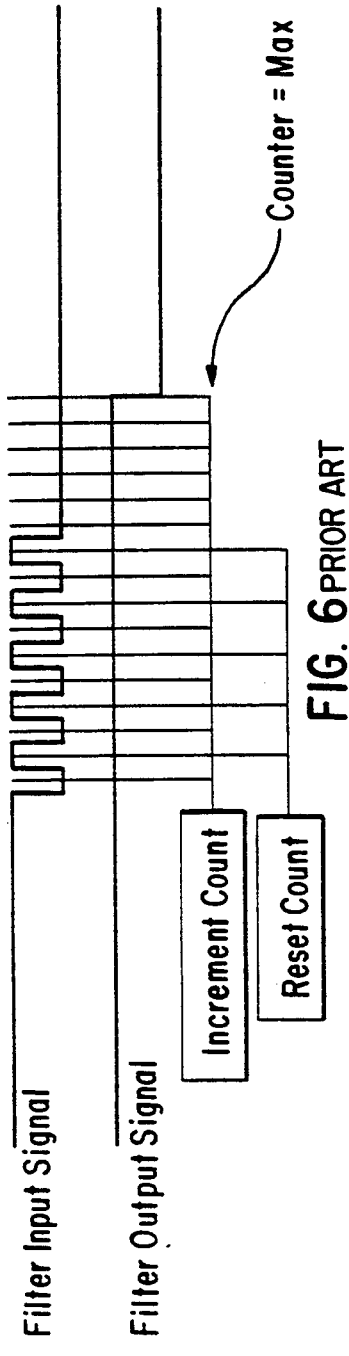
FIG. 6 is a timing diagram representative of a conventional counter based debounced filter.

The value of each signal at a point in time is either in an on state or an off state (logical "1" or logical "0"). FIG. 5 shows a filter input signal changing states several times before finally remaining in one state. FIG. 5 also shows a debounced filter output signal switching to its output state after the debounce filter time.

Using the microprocessor based filter of FIG. 3, the present invention debounces a whole byte or word of inputs without having to address each input separately. This method uses boolean arithmetic so that each bit can be treated separately while operating on a whole byte or word. Thus, an eight times improvement in speed over current methods is achievable using an 8-bit microprocessor. Greater improvements in speed are achieved with 16-bit and 32-bit microprocessors. This method also allows the filter to have different debouncing times for each input, even within the same byte of input values, by adjusting a customized mask sequence of values. This enables the filter of the present invention to be operated with a constant amount of microprocessor operation time (does not depend on the number of input being changed at any one time), thus allowing a more predictable real time response which is independent of the number of inputs changing.

Figure 7:
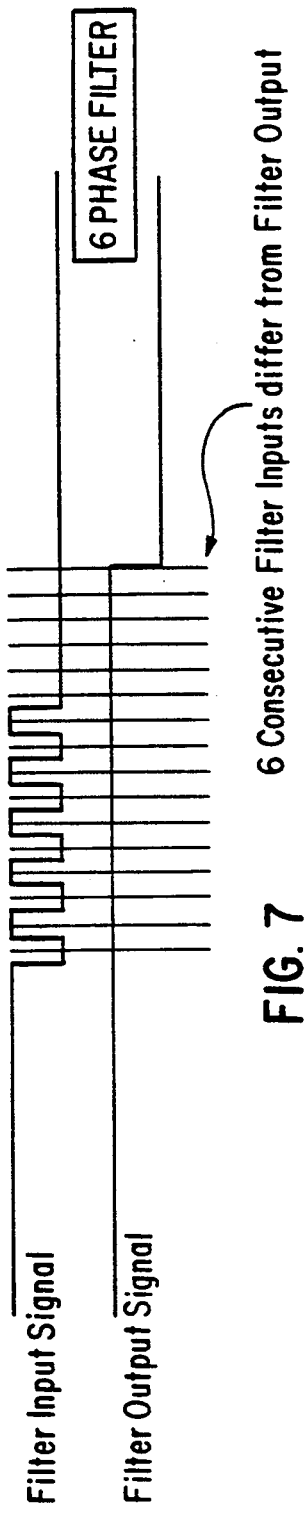
FIG. 7 is a timing diagram showing a filter output from the debounce filter of the present invention.
Figure 14:
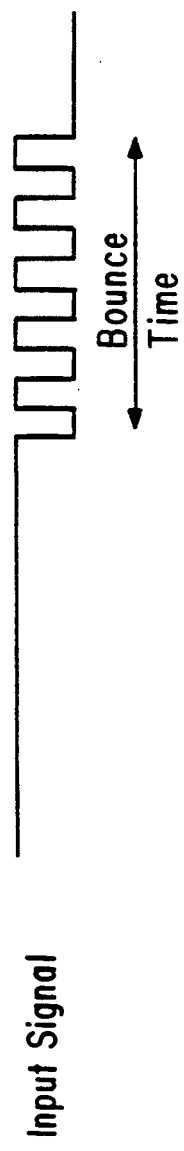
FIG. 14 is a timing diagram showing the bounce time of a binary signal.

The debounce filter changes the output value after a predetermined number of input binary values have differed from the current filter output value. The predetermined number of input binary values that need to differ from the previous output filtered value for the output to change is referred to as the number of phases of the filter. FIG. 7 is a timing diagram of a six phase debounce filter.

A one phase debounce filter reports out as a filtered output the previous input binary value, thus producing no debounce filtering. A two phase debounce filter requires two consecutive input values to differ from the current output value before the output value will be changed. In general, an x+1 phase debounce filter will debounce an input binary signal with a time constant corresponding to x sample intervals.

In order to describe the boolean filter, boolean equations will be used using the symbols "+" for the logic OR operation, "." for the logic AND operation, and "/" for the logic NOT operation. $R_n$ represents the current binary value, $R_{n-1}$ represents the next previous binary value (time n−1), and so forth until $R_{n-x}$ (time n−x). Similarly, $C_n$ represents the current filtered value, and $C_{n-1}$ represents the next previous filtered value. The general debounce filter is described by Equation 1:

$$C_n = C_{n-1} \cdot (R_n + R_{n-1} + R_{n-2} + \cdots + R_{n-x}) + (R_n \cdot R_{n-1} \cdot R_{n-2} \cdot \ldots \cdot R_{n-x}) \quad (1)$$

wherein input values R are processed with the next previous filtered value $C_{n-1}$ to produce the current filtered value $C_n$.

A selective debounce filter enables certain bits within the same byte or word of input signals to be debounced differently, or not at all according to a desired filter time constant. If the maximum number of phases to be implemented within the debounce filter is $x+1$, it is possible to make certain input signals (selected on a bit-by-bit basis) use a filter with less phases. A mask sequence $m_1-m_x$ is defined where the value of each element in the sequence is logic "1" to enable and logic "0" to disable. Thus, when mask elements $m_1-m_i$ (where i is less than x) are all enabled and $m_{i+1}-m_x$ are all disabled, then the debounce filter implemented will have a phase of i. The selective debounce filter is described by Equation 2:

$$C_n = C_{n-1} \cdot (R_n + (m_1 \cdot R_{n-1}) + (m_2 \cdot R_{n-2}) + \cdots + (m_x \cdot R_{n-x})) + (R_n \cdot (/m_1 + R_{n-1}) \cdot (/m_2 + R_{n-2}) \cdots (/m_x + R_{n-x})). \quad (2)$$

For example, FIG. 8 shows a one phase (no debounce) debounce filter where filtered value $C_n$ is always equal to input binary value $R_n$, regardless of the value of the previous output value $C_{n-1}$. FIGS. 9 and 10 show the input/output functions for a two and three phase debounce filter, respectively, according to Equation 1. FIG. 11 shows the filter output values as a function of input values for a three phase selective debounce filter with the mask sequence set for no debounce ($m_1$ and $m_2=0$), according to Equation 2. FIG. 12 shows the filter output values as a function of input values for a three phase selective debounce filter using a mask sequence set to produce a filter time response function equivalent to a two phase filter ($m_1=$"1" and $m_2=$"0") according to Equation 2. FIG. 13 shows the filter output values as a function of input values for a three phase selective debounce filter using a mask sequence set to produce a filter time response function equivalent to a three phase filter ($m_1$ and $m_2=$"1") according to Equation 2.

Figure 15:
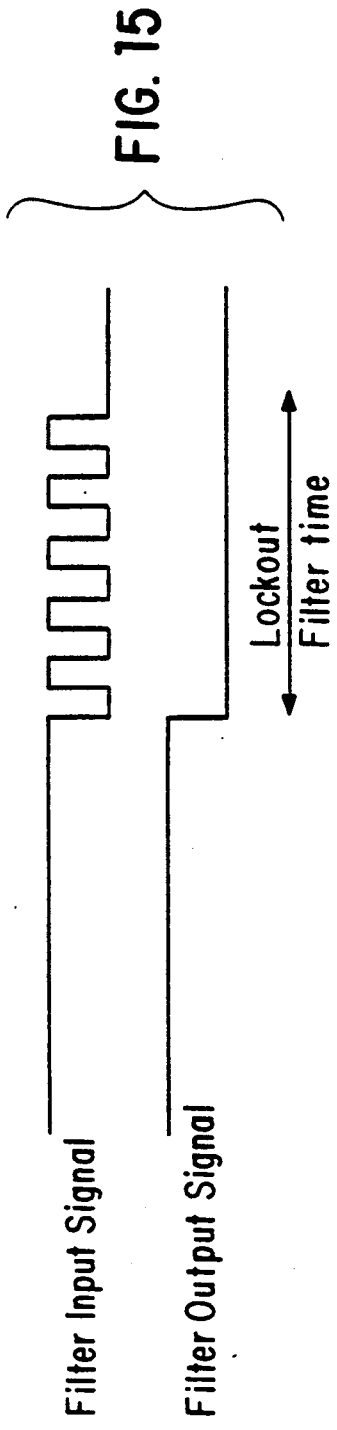
FIGS. 15 and 16 are timing diagrams showing filter outputs from a lockout filter of the present invention.
Figure 16:
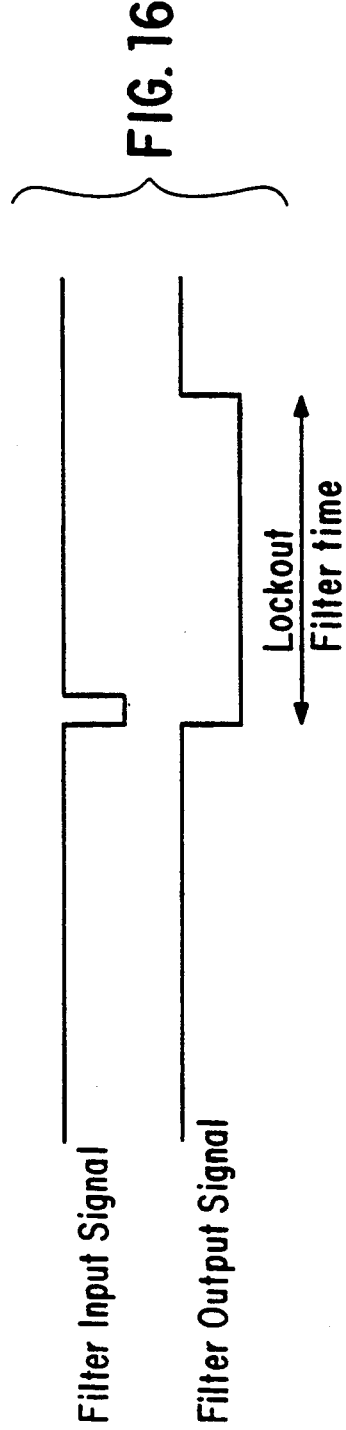

As can be appreciated, a debounce filter produces a filter output value after a debounce filter time delay. In cases where the debounce filter time delay is unacceptable, a lockout filter produces a change in filter output value immediately, and then locks out further changes in response to the filter input signal for a lockout filter time as shown in FIG. 15. Thus, a lockout filter, whether implemented in hardware or software, reports a change immediately, and then waits before reporting any further changes. FIG. 16 shows a filtered output signal reported immediately after a change in an input signal where a subsequent change in the input signal is not reported until after the lockout filter time.

As with the debounce filter, not all switches and sensors are characterized by the same debounce time, and the timing requirements of the system using the filtered outputs may be able to tolerate one lockout filter time from one signal but require a shorter lockout filter time from another signal. Thus, it is often necessary to process some inputs differently.

Figure 17:
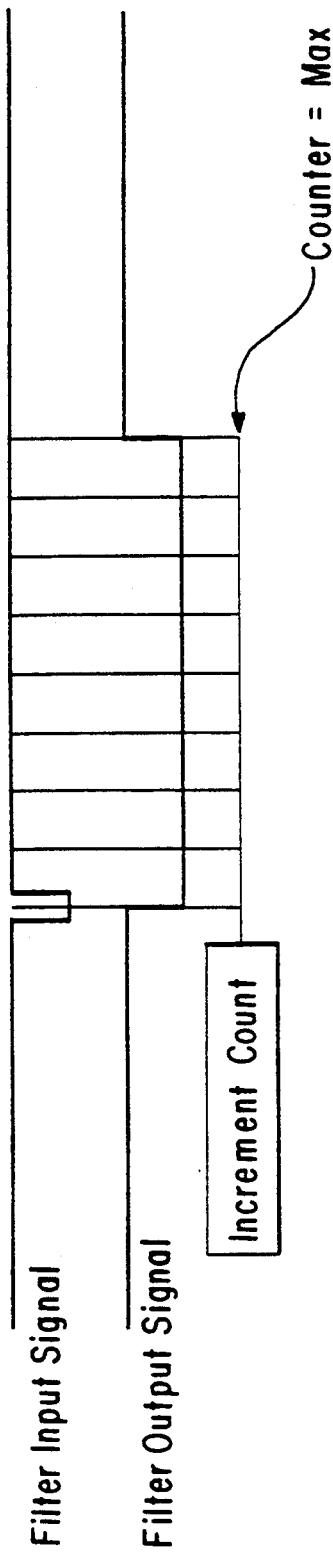
FIG. 17 is a timing diagram showing a filter output from a conventional counter based lockout filter.

As with the debounce filter, a known counter based method for implanting a lockout filter includes sampling a signal at a regular rate, and if the signal changes state, then reporting the change from the filter and incrementing the counter. All further changes are disabled until the counter reaches a predetermined maximum value. When the counter reaches this value, then additional changes in the input signal state are allowed to be reported. In this counter based method it is necessary to have a counter for every locked out input signal. This results in a large use of RAM and a significant execution time for every input. FIG. 17 is a timing diagram for a conventional counter based lockout filter.

The lockout filter of the present invention simultaneously processes a plurality of input binary signals so that it is possible to lock out a byte or word of input values without having to address each input value separately. This method uses boolean arithmetic so that each bit of the input word can be treated separately when operating on a byte or word of binary values.

Figure 18:
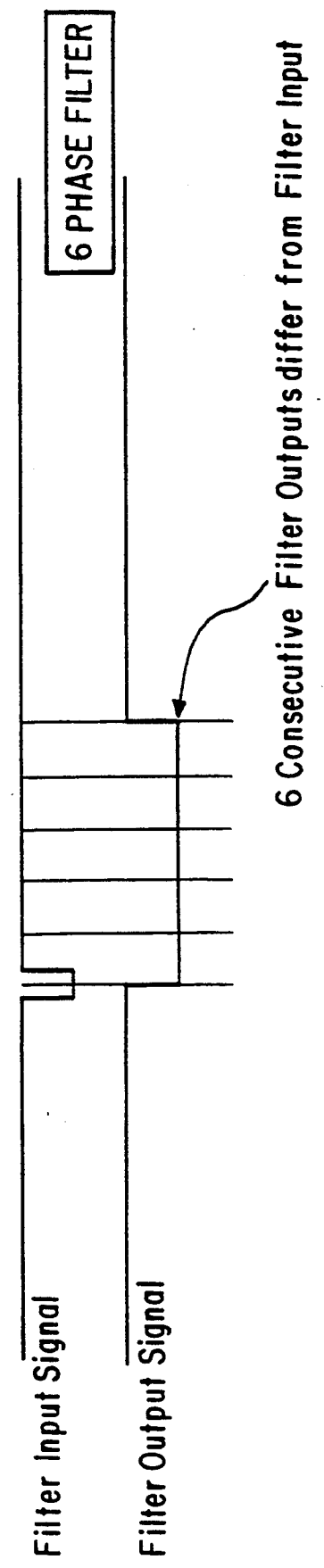
FIG. 18 is a timing diagram showing a filter output from the lockout filter of the present invention.

As shown in FIG. 18, the lockout filter allows the output filtered values to change after a predetermined number of output filter values have differed from the input binary value. The number of output filter values that needs to differ from the input binary value is referred to as the number of phases of the filter. A six phase filter is shown in FIG. 18.

The general lockout filter is described using boolean equation 3 and the selective lockout filter is described using boolean equation 4. For the lockout filter, the current output filtered value is $L_n$, the next prior output filtered value is $L_{n-1}$, and so forth until $L_{n-x}$. The lockout filter is therefore defined by boolean Equation 3:

$$L_n = R_n \cdot (L_{n-1} + /L_{n-x}) + (L_{n-1} \cdot /L_{n-x}). \quad (3)$$

Figure 22:
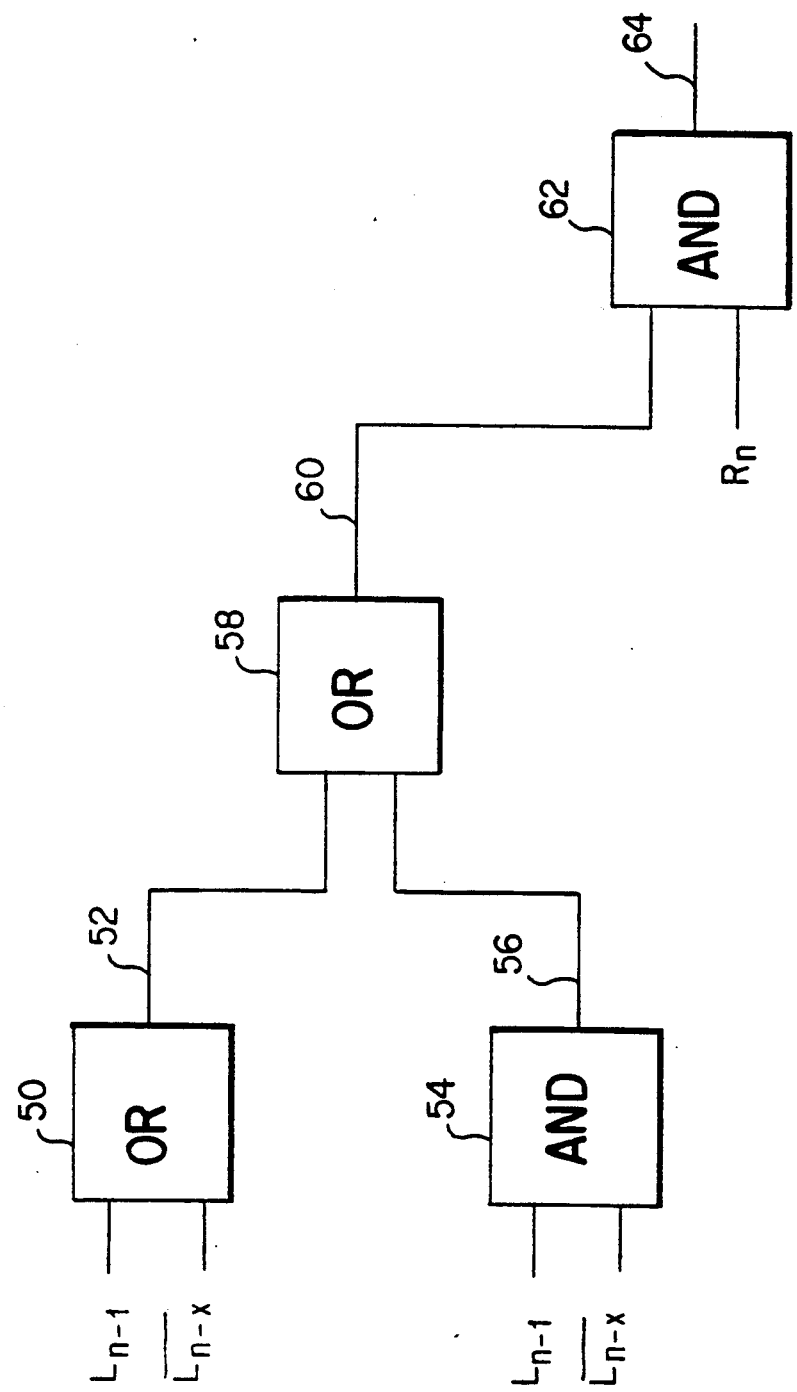
FIG. 22 is a block diagram of the logic of the filter of the present invention.

FIG. 22 shows a block diagram of Equation 3 for a two-phase lockout filter. The first OR block 50 determines a first signal 52 based on a logical OR function of the leading signal ($L_{n-1}$) with a logical compliment of the trailing signal ($/L_{n-x}$). The first AND block 54 determines a second signal 56 based on a logical AND function of the leading signal ($L_{n-1}$) with a logical compliment of the trailing signal ($/L_{n-x}$). The second OR block 58 combines the first signal 52 with the second signal 56 based on a logical OR function to form a third signal 60. The second AND block 62 determines the current filtered signal 64 based on a logical AND function of the current binary signal ($R_n$) with the third signal 60. As is known in the art, numerous logical components may be used to create the OR blocks 50, 58 and the AND blocks 54, 62.

In the selective lockout filter, a mask sequence $m_0-m_x$ permits certain signals (certain bits in the same byte or word) to be filtered differently, or not filtered at all. Thus, when the maximum number of phases of the lockout filter is implemented as $x+1$, it is possible to filter certain input signal, on a bit-by-bit basis, using a filter with less phases. The selected lockout filter is described by Equation 4:

$$L_n = R_n \cdot (L_{n-1} + (m_0 / L_{n-1}) + (m_1 \cdot / L_{n-2}) + \cdots + (m_x \cdot / L_{n-x})) + (L_{n-1} \cdot (/m_0 + /L_{n-1}) \cdot (/m_1 + /L_{n-2}) \cdots (/m_x + /L_{n-x})). \quad (4)$$

FIGS. 19–21 are tables showing lockout filter output filtered values as a function of input binary values for a one, two and three phase filter, respectively. Note that in FIG. 21, the struck-out sequences would not naturally occur for an on-going filter operation.

It will be appreciated by persons skilled in the art that lockout and debounce filters according to the present invention may be combined in any order to produce customized filter response functions. For example, a debounce filter may precede a lock out filter where the debounce filter time is selected to relate to a maximum width noise spike (e.g. cross-coupling noise) tolerated by the system noise margin design, and the lock out filter time relates to the bounce produced by the mechanical switch. It will also be appreciated that the debounce and lockout filters may be either implemented as a traversal or finite impulse response filter processing only input binary values or implemented as a recursive or infinite impulse response filter processing both input binary values and prior filter output values, noting of course that a true infinite impulse response is not achieved when the filter output is quantized to be in one of an on state and an off state.

Having described preferred embodiments for a novel method and filter for debouncing noisy signals, it is noted that modifications and variations can be made by persons skilled in the art in light of the above teachings. It is therefore to be understood that changes may be made in the particular embodiments of the invention disclosed which are within the scope and spirit of the invention as defined by the appended claims.

Having thus described the invention with the details and particularity required by the patent laws, what is claimed and desired protected by letters patent is set forth in the following claims.

1. A lockout filter for processing a plurality of binary signals into a plurality of filtered signals, the filter comprising:
   boolean means for simultaneously processing each binary signal through a corresponding one of a plurality of signal filters to produce a corresponding current filtered signal, each signal filter processing the corresponding current binary signal and a predetermined number of previous corresponding filtered signals to produce a corresponding current filtered signal; and
   repeating means for successively operating the boolean means to produce the corresponding current filtered signal for each signal filter, a successive current filtered signal being produced by each signal filter each time the boolean means is operated.

2. The lockout filter of claim 1, wherein the predetermined number of previous corresponding filtered signals for each signal filter is equal to the predetermined number of previous corresponding filtered signals for each of the other signal filters.

3. The lockout filter of claim 1, further comprising:
   filter memory means for storing at least one stored signal for each signal filter; and
   determining means for changing a state of each current filtered signal based on the corresponding current binary signal and the corresponding at least one stored signal, the at least one stored signal being repeatedly determined by the boolean means and repeatedly stored in the filter memory, the at least one stored signal comprising a leading signal and a trailing signal, the leading signal being a filter signal occurring immediately prior to the current filtered signal, the predetermined number of previous corresponding filtered signals comprising the leading signal and the trailing signal.

4. The lockout filter of claim 1, wherein the determining means further comprises:
   OR means for determining a first signal based on a logical OR function of the leading signal with a logical compliment of the trailing signal;
   AND means for determining a second signal based on a logical AND function of the leading signal with a logical compliment of the trailing signal; and
   output means for determining the current filtered signal based on a logical AND function of the current binary signal with the first signal logically combined with the second signal based on a logical OR function.

5. A multichannel filter for simultaneously and independently processing each input signal of a plurality of input signals to produce a corresponding plurality of output signals, the multichannel filter comprising:
   a plurality of independent filter channels, each independent filter channel filtering a corresponding input signal to produce a corresponding output signal; and
   adjusting means for independently adjusting a filter response time of each independent filter channel, wherein each output signal for each filter channel maintains one of a first state and a second state until a predetermined number of corresponding previous filter signals each differ from the current input binary signal.

6. A method for simultaneously processing a plurality of binary signals through a lockout filter having a corresponding plurality of signal filters to produce a corresponding plurality of filtered signals, the method comprising the steps of:
   simultaneously processing a current binary signal for each signal filter and a predetermined number of previous corresponding filtered signals to produce the corresponding current filtered signal; and
   repeating the step of simultaneously processing the binary signal and the predetermined number of previous filtered signals for each signal filter to successively produce the plurality of the current filtered signals, each filtered signal being successively produced as each successive corresponding binary signal is processed as the current binary signal.

7. A method for simultaneously and independently filtering a plurality of input signals to produce a corresponding plurality of output signals, the method comprising the steps of:
   simultaneously filtering each input signal through a corresponding independent filter to produce a corresponding output signal; and
   independently adjusting a filter response time of each independent filter, wherein each filter signal maintains one of a first state and a second state until a predetermined number of corresponding previous filter signals each differ from the current input binary signal, the predetermined number of corresponding filter signals being set by the corresponding filter response time.

* * * * *